United States Patent
Huerlimann

(10) Patent No.: US 11,119,156 B2
(45) Date of Patent: Sep. 14, 2021

(54) MONITORING ARRANGEMENT FOR MONITORING A SAFETY SENSOR AND METHOD FOR MONITORING A SAFETY SENSOR

(71) Applicant: TRUMPF Schweiz AG, Gruesch (CH)

(72) Inventor: Thomas Huerlimann, Bad Ragaz (CH)

(73) Assignee: TRUMPF Schweiz AG, Gruesch (CH)

( * ) Notice: Subject to any disclaimer, the term of this patent is extended or adjusted under 35 U.S.C. 154(b) by 283 days.

(21) Appl. No.: 16/184,358

(22) Filed: Nov. 8, 2018

(65) Prior Publication Data

US 2019/0072604 A1   Mar. 7, 2019

Related U.S. Application Data

(63) Continuation of application No. PCT/EP2017/061073, filed on May 9, 2017.

(30) Foreign Application Priority Data

May 11, 2016 (EP) .................................... 16169111

(51) Int. Cl.
*G01R 31/28* (2006.01)
*G01R 31/327* (2006.01)
(Continued)

(52) U.S. Cl.
CPC ..... *G01R 31/3277* (2013.01); *G01R 31/2829* (2013.01); *G01R 31/52* (2020.01); *H01H 9/54* (2013.01); *H01H 47/002* (2013.01)

(58) Field of Classification Search
CPC .............................................. G01R 31/3277
See application file for complete search history.

(56) References Cited

U.S. PATENT DOCUMENTS 5,894,274 A   4/1999   Kienapfel et al.
6,704,628 B1 *  3/2004   Fennel ................ G06F 11/0757
                                                        180/404
(Continued)

FOREIGN PATENT DOCUMENTS

CN     103448790 A     12/2013
CN     105074935 A     11/2015
(Continued)

OTHER PUBLICATIONS

CN Office Action in Chinese Appln. No. 201780029455, dated May 12, 2020, 37 pages (with English language translation).
(Continued)

*Primary Examiner* — Walter L Lindsay, Jr.
*Assistant Examiner* — Milton Gonzalez
(74) *Attorney, Agent, or Firm* — Fish & Richardson P.C.

(57) ABSTRACT

A monitoring arrangement for monitoring a security device includes a) a first electric supply source connected to an input terminal for connecting an input of the security device b) a first outlet side measuring device connected to the output terminal for connecting an output of the safety device, c) an evaluating assembly connected to the first output-sided measuring device and which receives a measuring signal, and d) a first input-sided measuring device connected to the input terminal and to the evaluation assembly, which captures the measuring signal of the first input-sided measuring device and is designed to evaluate the measuring signal.

18 Claims, 4 Drawing Sheets

(51) Int. Cl.
*G01R 31/52* (2020.01)
*H01H 47/00* (2006.01)
*H01H 9/54* (2006.01)

(56) References Cited

U.S. PATENT DOCUMENTS

| | | | |
|---|---|---|---|
| 8,035,396 B2* | 10/2011 | Kim | G01R 31/389 |
| | | | 324/430 |
| 9,276,406 B2* | 3/2016 | Sato | H02J 7/0021 |
| 9,778,320 B2* | 10/2017 | Voß | G01R 31/3278 |
| 2008/0278875 A1 | 11/2008 | Bauer et al. | |
| 2010/0156435 A1 | 6/2010 | Kangas | |
| 2012/0299578 A1 | 11/2012 | Korrek | |
| 2013/0320906 A1 | 12/2013 | Byun | |
| 2014/0362480 A1 | 12/2014 | Veil et al. | |
| 2015/0162747 A1 | 6/2015 | Iwasaki | |
| 2015/0357140 A1 | 12/2015 | Veil et al. | |
| 2016/0006392 A1 | 1/2016 | Höft | |
| 2016/0146889 A1 | 5/2016 | Voss | |
| 2016/0152156 A1* | 6/2016 | Pritelli | H03K 17/785 |
| | | | 320/136 |

FOREIGN PATENT DOCUMENTS

| | | |
|---|---|---|
| CN | 204903702 U | 12/2015 |
| DE | 197 02 009 | 7/1998 |
| DE | 198 05 722 | 9/1999 |
| DE | 10 2005 055 325 | 4/2007 |
| DE | 10 2006 027 135 | 9/2007 |
| DE | 10 2007 003 306 | 7/2008 |
| DE | 10 2009 031 040 | 1/2011 |
| DE | 10 2012 101 516 A1 | 8/2013 |
| DE | 10 2013 101 932 | 8/2014 |
| DE | 10 2013 101314 | 8/2014 |
| DE | 10 2013 106 487 | 12/2014 |
| DE | 10 2013 112 488 | 5/2015 |
| DE | 10 2014 219 235 | 3/2016 |
| EP | 1811592 A1 | 7/2007 |
| EP | 1 811 591 | 7/2007 |
| JP | H04-160374 | 6/1992 |
| JP | H04-160374 A | 6/1992 |
| JP | H10-213291 A | 8/1998 |
| JP | 2001-337761 A | 12/2001 |
| JP | 2007-087343 A | 4/2007 |

OTHER PUBLICATIONS

Feng et al., "Dual Power Automatic Switch Device Design," 2012 International Conference on Control Engineering and Communication Technology, Dec. 2012.

International Preliminary Report on Patentability in International Application No. PCT/EP2017/061073, dated Nov. 22, 2018, 20 pages (with English translation).

International Ssearch Report and Written Opinion in International Application No. PCT/EP2017/061073, dated Oct. 26, 2017, 31 pages (with English translation).

KR Office Action in Korean Appln. No. 10-2018-7035413, dated Feb. 26, 2020, 11 pages (with English translation).

JP Office Action in Japanese Appln. No. 2018-559360, dated Dec. 13, 2019, 8 pages (with English translation).

JP Office Action in Japanese Appln. No. 2018-7035413, dated Feb. 26, 2020, 11 pages (with English translation).

* cited by examiner

MONITORING ARRANGEMENT FOR MONITORING A SAFETY SENSOR AND METHOD FOR MONITORING A SAFETY SENSOR

CROSS REFERENCE TO RELATED APPLICATIONS

This application is a continuation of and claims priority under 35 U.S.C. § 120 from PCT Application No. PCT/EP2017/061073 filed on May 9, 2017, which claims priority from European Application No. EP 16 169 111.8, filed on May 11, 2016. The entire contents of each of these priority applications are incorporated herein by reference.

TECHNICAL FIELD

The invention relates to a monitoring arrangement for monitoring a safety sensor, and methods for monitoring a safety sensor.

BACKGROUND

To monitor the position of safety guards, protection doors, machine cover components, or other protection devices that safeguard the access to dangerous machine components or other dangerous locations, safety sensors identify if a protection device is accessible and prevent risks in a technically controlled manner, for example, by switching off the machine. Generally, the safety sensors are stationary and close to the protection device. It is possible to use, for example, safety switches as a safety sensor. If, for example, it is detected that a safety sensor is open, this may indicate that the protection device is open and that the machine, which is at least partially surrounded by the protection device, has to be moved or switched into a safe state. Safe states may, for example, be a monitored state, a controlled stop, reduced torque, reduced speed, safe movement direction, interruption of a laser beam by an optomechanical or optoelectrical shutter, or switching off.

Generally, a plurality of safety sensors are provided. To detect a dangerous state, the existence of a cross-circuit can also be identified, that is to say, a short-circuit between lines to which safety sensors are connected.

DE 197 02 009 A1 discloses a monitoring device with monitoring switches that are each connected to an electric power supply source and that are coupled to at least one evaluation unit that responds to the respective switch output. For cross-circuit monitoring, there is provision for the voltage supply of at least one monitoring switch of each group to be clocked by a clock in each case, wherein the evaluation unit monitors the potential change of the output of the clocked closed monitoring switch, which change is brought about by the corresponding clock, and the output of the at least one additional monitoring switch to which voltage is applied at the same time.

SUMMARY

An advantage of the present disclosure is providing a monitoring arrangement and a method for monitoring a safety sensor for more reliable detection of the state of the safety sensor and any cross-circuits.

A monitoring arrangement for monitoring a safety sensor as described herein includes:
a. a first electric power supply source connected to an input connection for connecting an input of the safety sensor,
b. a first output-side measuring device connected to an output connection for connecting an output of the safety sensor,
c. an evaluation arrangement connected to the first output-side measuring device and which receives the measurement signal thereof,
d. a first input-side measuring device connected to the input connection and the evaluation arrangement, wherein the evaluation arrangement receives the measurement signal of the first input-side measuring device and is configured to evaluate the measurement signals.

The evaluation arrangement may be configured to identify whether the safety sensor is open or closed or whether a cross-circuit is present. As a result of the fact that not only is a measurement signal detected at the output side of the safety sensor, but also a measurement signal is detected at the input connection of the safety sensor, it can be identified in a more reliable and rapid manner whether the safety sensor is open or closed or whether a cross-circuit is present. In particular, the detection of an opening of the safety sensor can be rapidly identified as a result of a low latency time as a result of immediately clear signal states.

Particular advantages are afforded if the electric power supply source is a controlled electric current source. An electric current source may allow a specific current to flow via the safety sensor. This current is, via a resistor that can be connected to the output connection, conducted to earth (ground), which leads to a current-dependent voltage decrease across the resistor. When the safety sensor is closed, both at the input and at the output of the safety sensor, that is to say, at the input connection and at the output connection, substantially the same voltage is measured. When the safety sensor is open, there is applied at the input of the safety sensor a greater voltage, e.g., a supply voltage of the current source, than at the output of the safety sensor. If this state is identified, the system that is monitored by the monitoring arrangement is moved or switched into a safe state, for example, switched off.

For identification of a cross-circuit, a control device for influencing an electrical variable that can be measured at the output connection may be provided. In this instance, the control device may be integrated in the electric power supply source. The power supply source may be a controllable current source. The current output from the power supply source can be modulated, e.g., it can be amplitude or frequency-modulated. For example, the current can be output in phase with a predetermined pulse pattern.

Alternatively, the control device may have a resistor and parallel therewith a controllable switch, by which the resistor can be bridged. Depending on the switch state, the voltage drop across the resistor changes, for example, in the phase of a pulse pattern or a modulation signal with which the switch is controlled. If there is no cross-circuit with a closed safety sensor, the voltages measured at the input and output of the safety sensor differ from each other only by a voltage drop across the safety sensor, that is to say, only slightly. However, if a cross-circuit from one safety sensor to another safety sensor that is monitored in the same manner is present, significant voltage differences occur and can be used to switch off the monitored system or the machine whose protection device is monitored by the monitoring arrangement. If a plurality of safety sensors are closed and there is a cross-circuit, voltage differences occur with respect to the anticipated voltages at the measurement locations, e.g., at the output connections.

The control device may be connected to the evaluation arrangement and is controlled by it. Consequently, the evaluation arrangement knows which signal influence the control device carries out, e.g., which current the controlled current source outputs, and can take this into account in the evaluation of the measured signals.

The evaluation arrangement can include a modulation signal generator that produces a modulation signal that controls the control device, e.g., the electric power supply source or the bridging switch. For example, the modulation signal generator may produce a modulation signal that brings about a frequency modulation or an amplitude modulation of the current output by the power supply source. The specification of a (digital) pulse pattern is intended to be understood to be an amplitude modulation of the current signal. A pulsed current can be output by the power supply source or the resistor can be bridged in a pulsed manner by the switch. Alternatively, a current that changes continuously within specific values can be output.

There are particular advantages when the evaluation arrangement has a first microprocessor that receives the measurement signals and evaluates them. It is possible to carry out a comparison of the measurement signals in a particularly simple and rapid manner by a microprocessor, and the measurement signals can be evaluated accordingly. Consequently, it can be identified in a particularly rapid manner whether the safety sensor is open or closed or whether there is a cross-circuit. The most significant advantage for the rapidity for an opening of the safety sensor is that in the unsafe state almost immediately and not only after the next interrogation cycle or the decoding of the next read pulse pattern there are clear error signals that can be used for the error reaction. For example, it is possible within 1-3 ms to identify an open safety sensor. Advantageously, the microprocessor can also include the modulation signal generator. The microprocessor therefore knows which measurement signals should be anticipated during failure-free operation or in an error-free state.

The evaluation arrangement can have a second microprocessor that receives the measurement signals and evaluates them. The use of a second microprocessor provides redundancy. Consequently, it can be ensured that a single error in the monitoring arrangement does not lead to the loss of the safety function. Particularly when the monitoring arrangement is intended to be used to monitor safety covers that protect operators from dangerous laser beams, the use of two microprocessors complies with the ISO13849 Safety of machinery-safety-related parts of control systems and DIN EN ISO 13849-1 Safety of machinery-safety-related parts of control systems standards. The failure of one of the microprocessors or an error in the wiring therefore cannot lead to an unsafe state.

The first microprocessor and the second microprocessor can be connected via a data link, e.g., via a bus system, and each microprocessor can receive the measurement signal of a measuring device directly therefrom and can receive the other measurement signal indirectly from the other microprocessor via the data link. Consequently, the measurement signals at the input and output of a safety sensor are available to each microprocessor and can independently of the other microprocessor carry out a comparison of the measurement signals and draw conclusions relating to the state of the safety sensor.

The complexity of the wiring can be reduced by each microprocessor being connected only directly to one measuring device associated with a safety sensor to be monitored, and receiving the measurement signal of the other measuring device associated with the safety sensor monitored by the other microprocessor. Via the data link the comparison results that are established by the respective microprocessor can also be exchanged and compared. It is possible to use a Controller Area Network (CAN) bus as a data link.

Particular advantages are afforded when at least one additional input connection and one additional output connection connect an additional safety sensor, wherein the at least one additional input connection is connected to a second electric power supply source and a second input-side measuring device and the at least one additional output connection is connected to a second output-side measuring device. Consequently, a plurality of safety sensors can be monitored. Furthermore, a cross-circuit can be detected in a simple manner.

To identify a cross-circuit, it is particularly advantageous for each control device to be controlled with a different modulation signal. If controlled current sources are used, each current source may output a different current. In this instance, it is irrelevant whether the control devices are controlled by the first or second microprocessor. It is also conceivable for one microprocessor to control the control devices at times and the other microprocessor to control the control devices at times. It is significant that the signals output by the control devices, e.g., currents, can be distinguished. For this reason, it is advantageous for a microprocessor to be responsible for producing the modulation signals for all the control devices.

The output signals of the microprocessors can be interconnected in such a manner that if only one of them fails or transmits a signal that indicates a cross-circuit or an open safety sensor, the machine which is monitored is brought into a safe state. The measurement signal comparison can be carried out by both microprocessors independently of each other. They each compare the voltage of the measuring device that is directly connected to the microprocessor with the voltage that is obtained via the other microcontroller and via the data link with the desired voltage that is anticipated or the difference of the voltages with a predetermined value. The desired voltage corresponds in this instance, for example, to the product of the modulated current of the power supply source and the resistor that is connected to the output connection.

The scope of the disclosure further includes methods for monitoring a safety sensor having the method steps:

a. supplying the input connection of the safety sensor with an electric power supply Signal, b. measuring an electrical variable at the input connection of the safety sensor, c. measuring an electrical variable at the output connection of the safety sensor, d. comparing the electrical variables or related variables and/or comparing the variable measured at the output connection or a related variable with an anticipated variable, and e. determining on the basis of the comparison whether the safety sensor is open or closed or whether a cross-circuit is present.

The above-mentioned advantages can be achieved using these methods.

In some embodiments, an electrical variable can be measured when the safety sensor is closed at the output-side connection to be modulated, e.g., for the power supply signal to be modulated, e.g., amplitude or frequency-modulated. This is particularly advantageous when it is intended to identify a cross-circuit. In this instance, the variable, e.g., the supply signal, should be modulated differently for each safety sensor. The advantage of the present disclosure compared with cross-circuit identification using pure voltage pulse patterns is that, in spite of the modulation for the cross-circuit identification, no dead times for the identification of an open safety sensor occur, because it is not necessary to wait to find out whether a zero signal is part of the pulse pattern or is caused by an open safety sensor. Consequently, the modulation for cross-circuit identification does not have to be carried out rapidly, although at the same time an open safety sensor can be identified very quickly by clear signals.

The supply signal can be produced by a current source, wherein the current source is controlled in such a manner that the current >0 A and the voltage output, e.g., with a closed safety sensor, is below the supply voltage. The maximum voltage that can be output by the current source is the supply voltage of the current source. However, this should be present only in the event of an error, that is to say, when the safety sensor is open. For the modulation, the maximum value is selected, typically in such a manner that the voltage measured across the resistor in the normal case (safety sensor closed) complies with an interference distance with respect to this supply voltage.

A particularly simple evaluation is produced when voltages are measured as electrical variables.

It is possible to detect that the safety sensor is open when at the input connection of the safety sensor a supply voltage and at the output connection a voltage in the region of 0 V is measured. At the output connection, voltage of 0 V can be measured.

It is possible to detect that the safety sensor is closed when the difference of the, e.g., modulated, voltages, measured, at the input connection and at the output connection of the safety sensor is smaller than a predetermined first value. The predetermined first value may correspond to the voltage drop that is to be anticipated across the safety sensor. The predetermined first value may be predetermined in the region of 0 V.

It can be detected that a cross-circuit is present when the variable measured at the output connection of the safety sensor, e.g., the modulated voltage, deviates from an anticipated variable. The anticipated variable may in this instance be established by the modulation signal that is associated with the safety sensor that is monitored in each case.

The method steps a. to e. can be carried out for a plurality of safety sensors, wherein a different modulation signal is used for each safety sensor. In this manner, a cross-circuit can be identified in a particularly reliable manner.

Other features and advantages of the invention will be appreciated from the following detailed description of embodiments of the invention, with reference to the Figures of the drawings, which show details which are inventively significant, and from the claims. The features which are set out therein are not necessarily intended to be understood to be drawn to scale and are illustrated in such a manner that the specific features can be made clearly visible. The different features may be implemented individually per se or together in any combinations in variants of the invention.

Embodiments of the invention are illustrated in the schematic drawings and are explained in greater detail in the following description.

DETAILED DESCRIPTION

Figure 1:
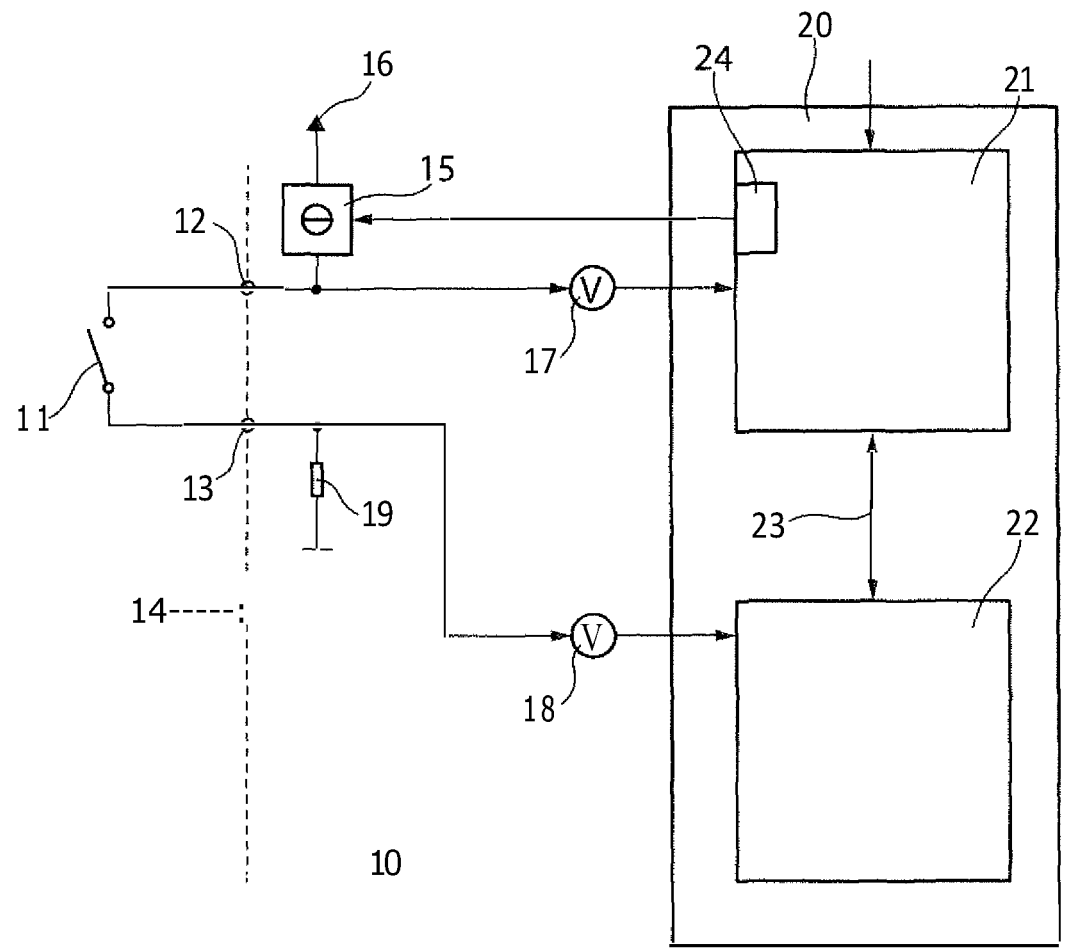
FIG. 1 is a first embodiment of a monitoring arrangement.

FIG. 1 shows a monitoring arrangement 10 for monitoring a safety sensor 11 shown as a safety switch. The safety sensor 11 may be connected to an input connection 12 and to an output connection 13 of the monitoring arrangement 10. The broken line 14 is intended to illustrate the interface with the safety sensor 11. A power supply source 15 is a controlled current source and is connected to the input connection 12. The input connection 12 in turn is connected to a supply voltage 16. A first input-side measuring device 17 is also connected to the input connection 12. A first output-side measuring device 18 is connected to the output connection 13. A resistor 19 is connected to the output connection 13. The measuring device 18 can measure a voltage across the resistor 19, which is also applied to the output connection 13.

An evaluation arrangement 20 includes a first microprocessor 21 and a second microprocessor 22. The first microprocessor 21 is connected to the first input-side measuring device 17 and receives the measurement signal thereof directly. The second microprocessor 22 is connected to the first output-side measuring device 18 and receives the measurement signal thereof directly. The microprocessors 21, 22 are connected to each other via a data link, in the embodiment shown by a bus system 23. Via the bus system 23, the first microprocessor 21 receives from the second microprocessor 22 the measurement signal of the first output-side measuring device 18 and correspondingly the microprocessor 22 receives the measurement signal of the first input-side measuring device 17 via the microprocessor 21.

The microprocessor 21 and consequently the evaluation arrangement 20 has a modulation signal generator 24 that provides a modulation signal for controlling the power supply source 15. The supply signal output by the power supply source 15, e.g., a current signal, is thereby modulated. Consequently, there is a control device (not shown) integrated in the power supply source 15 that influences an output signal of the power supply source 15 and consequently an electrical variable (with the safety sensor 11 closed) that can be measured at the output connection 13. The modulation signal may bring about an amplitude modulation, a frequency modulation and/or the production of a pulsed current signal.

In the microprocessors 21, 22, the measurement signals detected are evaluated, e.g., compared with each other. As a result of the comparison of the measurement signals, it is possible to identify whether the safety sensor 11 is open, whether it is closed, or whether there is a cross-circuit.

Figure 2:
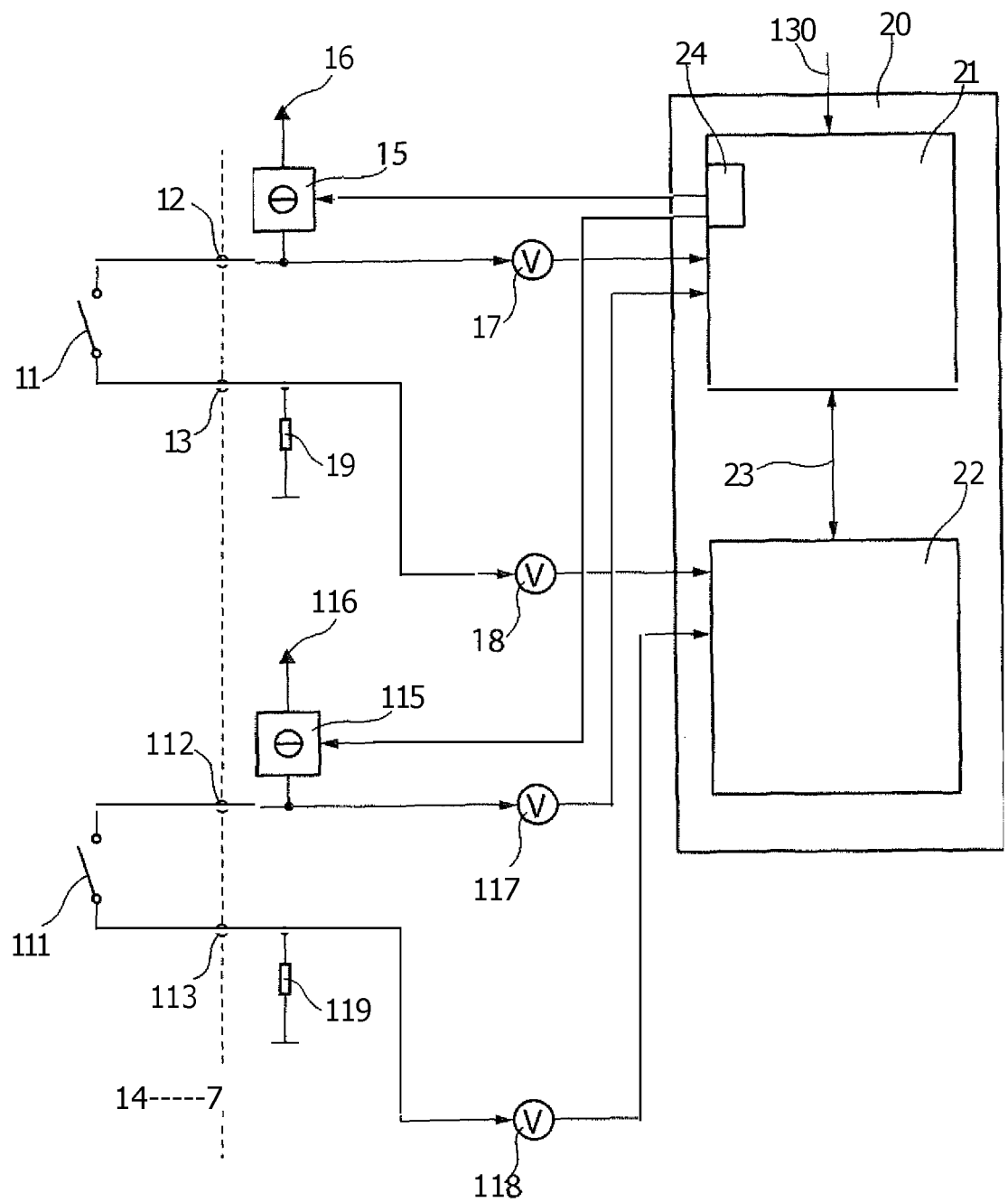
FIG. 2 is a second embodiment of a monitoring arrangement.

FIG. 2 shows another embodiment of a monitoring arrangement 100. Elements that correspond to those of FIG. 1 have the same reference numerals. In addition to the elements of the monitoring arrangement 10 of FIG. 1, the monitoring arrangement 100 of FIG. 2 has an additional input connection 112 and another output connection 113 for connecting another safety sensor 111. Another power supply source 115 that is connected to a supply voltage 116 is connected to the input connection 112.

The input connection 112 is connected to a second input-side measuring device 117 that is also connected to the evaluation device 20 and at that location to the first microprocessor 21. A resistor 119 is also connected to the output connection 113 and a second output-side measuring device 118 that is also connected to the evaluation arrangement 20 and at that location to the second microprocessor 22. The signal of the second input-side measuring device 117 in turn via the first microprocessor 21 and the bus connection 23 reaches the second microprocessor 22 and accordingly the measurement signal of the second output-side measuring device 118 reaches the microprocessor 22 via the microprocessor 21 and the bus connection 23.

The microprocessors 21, 22 can consequently also compare and evaluate the signals measured at the input side and at the output side of the safety sensor 111 with each other.

The power supply source 115 is connected to the modulation signal generator 24. The modulation signal generator 24 is configured to supply to the power supply source 115 a different modulation signal from the power supply source 15. It is thereby possible in a more reliable manner to detect a cross-circuit. It is known to the microprocessors 21, 22 which modulation signals the modulation signal generator 24 produces so that this can be taken into account during the evaluation of the measurement signals. If it is identified that one of the safety sensors 11, 111 is open or there is a cross-circuit or one of the microprocessors 21, 22 has failed, the monitored machine is moved or switched by one of the microprocessors 21, 22 into a safe state.

The evaluation arrangement 20 is connected via a bus system 130 to a superordinate control unit for information exchange.

The monitoring arrangement 100 may have any number of additional input and output connections with power supply sources connected thereto, resistors and measuring devices which are connected to the evaluation arrangement 20, for connecting additional safety sensors.

Figure 3A:
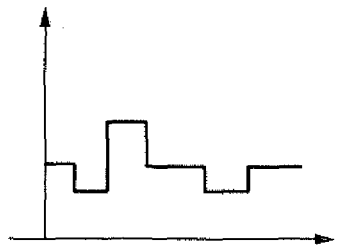
FIGS. 3A to 3C show signal paths for illustrating the identification of a closed safety sensor.
Figure 3B:
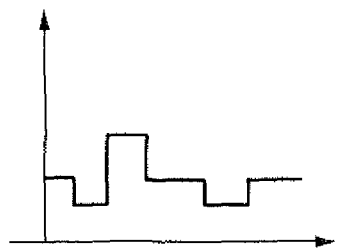
Figure 3C:
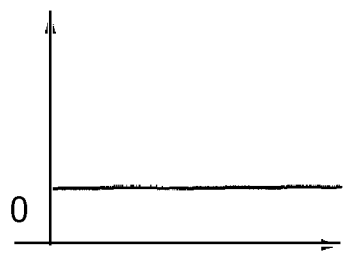

FIG. 3A shows a voltage that was measured by the measuring device 17. FIG. 3B shows a voltage that was detected by the measuring device 18 at the output connection 13. FIG. 3C shows the difference of the voltages of FIGS. 3A and 3B. Since both at the input connection 12 and at the output connection 13, almost the same voltage was measured, the difference is almost 0 V (the voltage drop across the safety sensor). This indicates that the safety sensor 11 is closed and no cross-circuit is present. The voltages of FIGS. 3A, 3B are produced as a result of a pulsed current signal of the power supply source 15 at the resistor 19. The signal of FIG. 3B is anticipated for the modulation signal used. If another signal form is measured, this may indicate a cross-circuit.

Figure 4A:
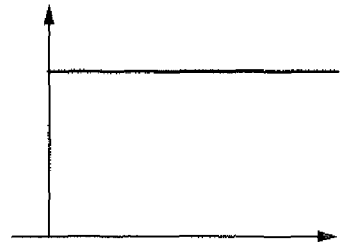
FIGS. 4A to 4C show signal paths for explaining the identification of an open safety sensor.
Figure 4B:
Figure 4C:
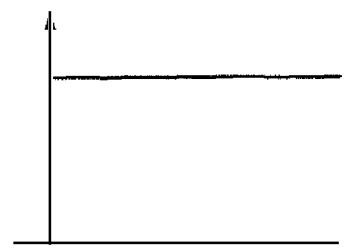

FIG. 4B shows the signal that was measured at the input connection 12 by the measuring device 17. This signal corresponds to the supply voltage 16 of the power supply source 15. In this instance, however, in FIG. 4B, no voltage is detected at the output connection 13. The difference produced, which is illustrated in FIG. 4C, corresponds to the signal of FIG. 4A. The measured voltage is consequently not equal to 0 V, which indicates that the safety sensor 11 is open. No voltage has dropped at the resistor 19.

Figure 5:
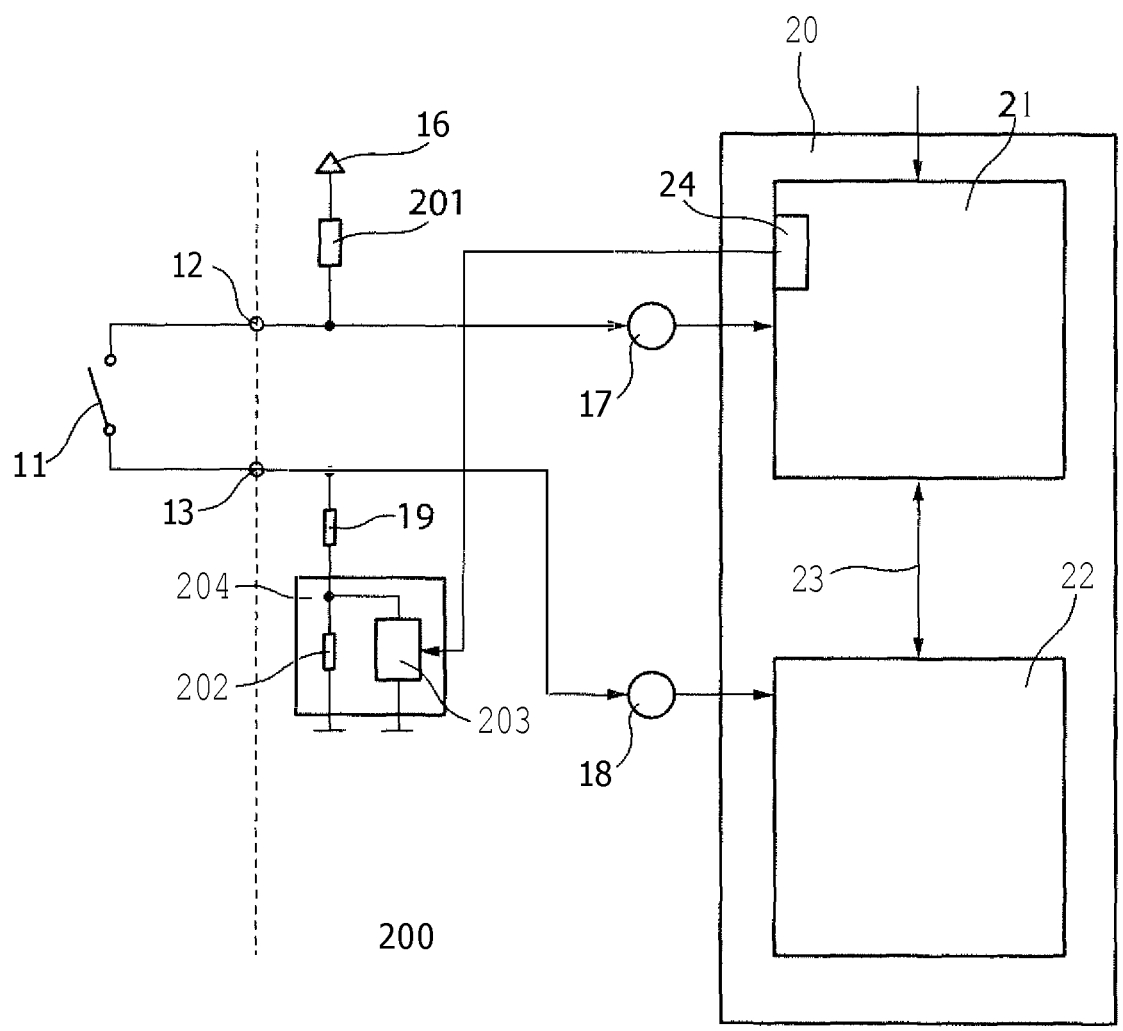
FIG. 5 shows a third embodiment of a monitoring arrangement.

FIG. 5 shows another embodiment of a monitoring arrangement 200. Elements that correspond to those of FIG. 1 have the same reference numeral. In the monitoring arrangement of FIG. 5, the supply voltage 16 is connected via a resistor 201 to the input connection 12. The supply voltage 16 and the resistor 201 form the power supply source.

Another resistor 202 is arranged in series with the resistor 19. There is arranged in parallel with the resistor 202 a switch 203 by which the resistor 202 can be bridged. The resistor 202 and the switch 203 form a control device 204. The control device 204 and at that location the switch 203 are controlled by the modulation signal generator 24. If the switch 203 is accordingly switched to a conductive state, the voltage measured at the output connection 13 decreases. The variable measured by the measuring device 18 can consequently be influenced by the control device 204.

Other Embodiments

A number of embodiments of the invention have been described. Nevertheless, it will be understood that various modifications may be made without departing from the spirit and scope of the invention. Accordingly, other embodiments are within the scope of the following claims.

What is claimed is:

1. A monitoring arrangement for monitoring a safety sensor, the arrangement comprising:
a first electric power supply source connected to an input connection for connecting an input of the safety sensor;
a first output-side measuring device connected to an output connection for connecting an output of the safety sensor;
an evaluation arrangement connected to the first output-side measuring device that receives a first measurement signal from the first output-side measuring device; and
a first input-side measuring device connected to the input connection and the evaluation arrangement; and
a control device connected to the input connection and configured to influence an electrical variable that is measurable at the output connection when the safety sensor is closed, wherein the evaluation arrangement comprises a modulation signal generator that produces a modulation signal that controls the control device,
wherein the evaluation arrangement receives a second measurement signal from the first input-side measuring device and is configured to evaluate the first and second measurement signals.

2. The monitoring arrangement of 1, wherein the control device is connected to the evaluation arrangement and is controlled by it.

3. The monitoring arrangement of claim 1, wherein the control device is integrated in the first electric power supply source.

4. The monitoring arrangement of claim 1, wherein the control device has a resistor configured to be bridged by a switch that is connected in parallel.

5. The monitoring arrangement of claim 1, wherein the evaluation arrangement has a first microprocessor that receives the first and the second measurement signals and evaluates them.

6. The monitoring arrangement of claim 5, wherein the evaluation arrangement has a second microprocessor that receives the first and the second measurement signals and evaluates them.

7. The monitoring arrangement of claim 6, wherein the first and the second microprocessors are connected to each other via a data link, and each microprocessor receives one of the first and the second measurement signals directly therefrom and receives the other one of the first and the second measurement signals indirectly via the other microprocessor and the data link.

8. The monitoring arrangement of claim 7, wherein the data link is a bus system.

9. The monitoring arrangement of claim 1, wherein at least one additional input connection and at least one additional output connection are configured to connect to an additional safety sensor, wherein the at least one additional input connection is connected to a second electric power supply source and a second input-side measuring device, and wherein the at least one additional output connection is connected to a second output-side measuring device.

10. A method for monitoring a safety sensor, the method comprising:
supplying an input connection of the safety sensor with an electric power supply signal;
measuring an electrical variable at the input connection of the safety sensor;
measuring an electrical variable at an output connection of the safety sensor;
comparing the measured electrical variables or related variables or comparing the electrical variable measured at the output connection with an anticipated variable, or performing both comparisons;
determining, on the basis of the one or more comparisons, whether the safety sensor is open or closed or whether a cross-circuit is present; and
modulating at the input connection an electrical variable that is measurable at the output connection when the safety sensor is closed.

11. The method of claim 10, wherein the electric power supply signal is modulated.

12. The method of claim 10, wherein the electrical variable is amplitude or frequency-modulated.

13. The method of claim 10, wherein the electric power supply signal is produced by a current source, wherein the current source is controlled such that the current is greater than 0 A and a voltage output with the safety sensor closed is below a supply voltage.

14. The method of claim 10, wherein voltages are measured as electrical variables.

15. The method of claim 14, further comprising detecting that
the safety sensor is open when at the input connection of the safety sensor a supply voltage is measured and at the output connection a voltage in the region of 0 V is measured,
the safety sensor is closed when a difference of the voltages measured at the input connection and at the output connection of the safety sensor is smaller than a predetermined first value, or
a cross-circuit is present when the voltage measured at the output connection of the safety sensor deviates from an anticipated voltage.

16. The method of claim 14, wherein the voltage measured at the output connection of the safety sensor is modulated.

17. The method of claim 10, further comprising carrying out the method for a plurality of safety sensors, wherein a different modulation signal is used for each safety sensor.

18. The method of claim 10, further comprising comparing related variables or comparing the electrical variable measured at the output connection with an anticipated variable, or performing both comparisons.

* * * * *